US010168749B2

(12) United States Patent
Aoki et al.

(10) Patent No.: US 10,168,749 B2
(45) Date of Patent: Jan. 1, 2019

(54) COOLING USING ADJUSTABLE THERMAL COUPLING

(71) Applicant: Intel Corporation, Santa Clara, CA (US)

(72) Inventors: Russell S. Aoki, Tacoma, WA (US); Devdatta P. Kulkarni, University Place, WA (US); Alan W. Tate, Puyallup, WA (US); Robin A. Steinbrecher, Olympia, WA (US); Ralph W. Jensen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/366,799

(22) Filed: Dec. 1, 2016

(65) Prior Publication Data

US 2018/0157296 A1 Jun. 7, 2018

(51) Int. Cl.
| | |
|---|---|
| *H05K 7/20* | (2006.01) |
| *G06F 1/20* | (2006.01) |
| *F28F 9/26* | (2006.01) |
| *H05K 1/02* | (2006.01) |
| *H05K 1/18* | (2006.01) |
| *H01L 23/40* | (2006.01) |
| *H01L 23/473* | (2006.01) |

(52) U.S. Cl.
CPC .............. *G06F 1/20* (2013.01); *F28F 9/266* (2013.01); *H01L 23/40* (2013.01); *H01L 23/473* (2013.01); *H05K 1/0203* (2013.01); *H05K 1/18* (2013.01); *H05K 7/2049* (2013.01); *H05K 7/20254* (2013.01); *H05K 7/20509* (2013.01); *F28F 2280/10* (2013.01)

(58) Field of Classification Search
None
See application file for complete search history.

(56) References Cited

U.S. PATENT DOCUMENTS

| | | |
|---|---|---|
| 5,829,516 A | 11/1998 | Lavochkin |
| 6,191,945 B1 | 2/2001 | Belady et al. |
| 6,285,550 B1 | 9/2001 | Belady |
| 6,452,804 B1 | 9/2002 | Dibene, II et al. |
| 7,385,824 B2 | 6/2008 | Barsun et al. |
| 8,498,117 B2 | 7/2013 | Andric et al. |
| 9,210,831 B2 | 12/2015 | Arvelo et al. |

(Continued)

FOREIGN PATENT DOCUMENTS

WO  WO2009-143330 A2  11/2009

OTHER PUBLICATIONS

Ellsworth et al., "An Overview of the IBM Power 775 Supercomputer Water Cooling System," Journal of Electronic Packaging, Jun. 2012, vol. 134, by ASME, pp. 020906-1 to 020906-9.

(Continued)

*Primary Examiner* — Courtney Smith
(74) *Attorney, Agent, or Firm* — Schwabe, Williamson & Wyatt, P.C.

(57) ABSTRACT

Embodiments described herein may include apparatus, system and/or processes to provide an adjustable thermal coupling between cold plate coupled to a first heat source and a liquid-cooled cold plate cooling a second heat source. In embodiments, the adjustable thermal coupling may provide a degree of freedom along an access in accommodating a dimension requirement of the second heat source. Other embodiments may be described and/or claimed.

20 Claims, 6 Drawing Sheets

(56) References Cited

U.S. PATENT DOCUMENTS

| | | |
|---|---|---|
| 9,342,118 B2 | 5/2016 | Barina et al. |
| 2006/0050483 A1 | 3/2006 | Wilson et al. |
| 2007/0227709 A1 | 10/2007 | Upadhya et al. |
| 2008/0084664 A1 | 4/2008 | Campbell et al. |
| 2008/0117593 A1 | 5/2008 | Andric et al. |
| 2013/0299158 A1 | 11/2013 | Eriksen |
| 2015/0131224 A1 | 5/2015 | Barina et al. |
| 2015/0346783 A1 | 12/2015 | Kinstle, III |
| 2016/0079140 A1 | 3/2016 | Arvelo et al. |

OTHER PUBLICATIONS

Clustered System Company, Inc, "Recover Act: Development of a Very Dense Liquid Cooled Compute Platform," Energy Research and Development Division Final Project Report, California Energy Commission, Feb. 2013, CEC-500-2014-020, 56 pages.

International Search Report and Written Opinion dated Jan. 31, 2018 for International Application No. PCT/US2017/055174, 9 pages.

COOLING USING ADJUSTABLE THERMAL COUPLING

FIELD

Embodiments of the present disclosure generally relate to the field of computing systems. More specifically, embodiments of the present disclosure relate to cooling electronic and/or optical components in a computing system.

BACKGROUND

As electronic components decrease in size and increase in power requirements, cooling individual components as well as collections of components will become increasingly important to ensure proper computing system function moving forward. For example, the size of central processing unit (CPU) dies are miniaturizing at the same time the number of cores, heat dissipation, and thermal design power (TDP) of these dies are increasing. This can result in a higher heat flux from the CPU dies and increase the challenge for thermally managing the CPU.

Legacy air cooled reference platforms are typically built per American Society of Heating, Refrigerating and Air-Conditioning Engineers (ASHRAE) Class A2. In legacy implementations to support high-power dense solutions, liquid-enhanced cooling solutions are typically used where components are cooled by liquid cold plates. To capture heat and remove it, gap filler thermal interface material in thermal contact with a cold plate and one or more heat-generating components, such as a central processing unit (CPU), that on a printed circuit board (PCB). In addition, there may be other heat-generating components in proximity to the CPU on the PCB that may also generate heat.

In order to achieve the required compute performance in current platforms, the trend is to increase power and also lower the operating temperature of the device. For applications such as high performance computing and next generation computing platforms, like the Xeon platforms from Intel® Corporation of Santa Clara, Calif., the need for liquid cooling in a platform may be becoming a necessity to achieve the desired compute performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
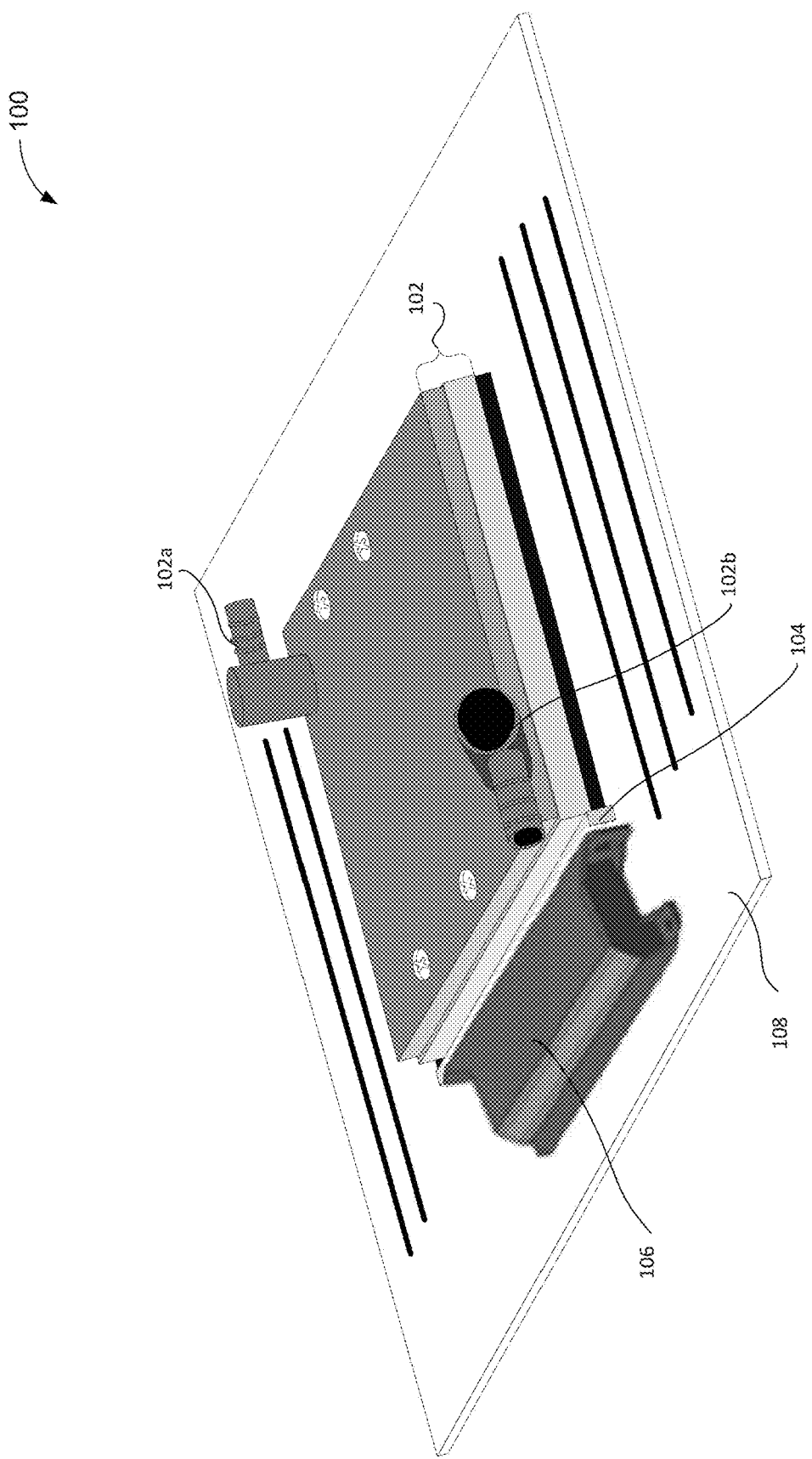
FIG. 1 illustrates an example implementation of cooling using adjustable thermal coupling, in accordance with various embodiments.

Embodiments described herein may include apparatus, system and/or processes to provide an adjustable thermal coupling between cold plate coupled to a first heat source and a liquid-cooled cold plate cooling a second heat source. In embodiments, the first heat source may be a liquid-cooled cold plate for a central processing unit (CPU). The second heat source may be an adaptable voltage regulator (VR) cold plate.

In embodiments, the adjustable thermal coupling may allow Z-height flexibility for a VR cold plate with respect to a CPU liquid-cooled cold plate. Embodiments may have advantages in readily accommodating cooling VR components having different heights on a PCB by adjustably attaching a VR cold plate to an existing liquid-cooled cold plate of a CPU, also mounted on the PCB, in proximity to the VR. With these configurations, cold plates attached to different VR designs with different heights may be thermally coupled with liquid-cooled cold plates of the CPU by first adjusting for the different VR heights and then securing the adjustable thermal coupling. This process may reduce the strain on the PCB while providing cooling for both VR's and CPUs. In embodiments, a Z-height may represent a height distance perpendicular to the PCB plane.

In embodiments, providing cooling using adjustable thermal coupling may provide several advantages. One advantage may relate to cost. For example, the cost associated with liquid cooling may be high compared to existing air cooling approaches. Current VR liquid cooling approaches use a separate liquid loop or a large machined cooling block to cool the VR. Embodiments may leverage the cost invested into the CPU liquid-cooled cold plate by tying the VR cold plate thermally and mechanically to the CPU cold plate. Thus, no additional liquid lines may be needed for the VR. In embodiments, the VR cold plate may be pure copper and may rely on conduction to transfer heat from the VR to the CPU liquid-cooled cold plate.

Another advantage may relate to adjustability. In embodiments, a VR cold plate may be able to use a universal interface with a CPU liquid-cooled cold plate. This may readily allow for different VR designs for PCB to have custom VR cold plates ready for manufacturing. The customer may use various VR cold plate designs while still having them interface with the same CPU cold plate.

Another advantage may relate to Z-height adjustability. An adjustable VR cold plate Z-height setting may allow the user to accommodate different VR suppliers that may have different Z-height VR components for the same motherboard. In addition, adjustable thermal coupling may allow the cold plate to mechanically and thermally couple with the VR to minimize the thermal interface material (TIM) thickness between the VR and the VR cold plate. This may lead to improved thermal performance.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical, thermal or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact. By way of example and not limitation, a computing apparatus may include two or more computing devices "coupled" on a motherboard or by one or more network linkages.

FIG. 1 illustrates an example implementation of cooling using adjustable thermal coupling, in accordance with various embodiments. Diagram 100 shows a liquid-cooled cold plate 102 cooling a CPU (not shown) which may be thermally connected to the liquid-cooled cold plate 102. Liquid to cool the liquid-cooled cold plate may flow from an inlet 102a through the cold plate 102 to an outlet 102b. A VR cold plate 106 may be cooling a VR (not shown) underneath the VR cold plate 106. In embodiments, CPU and the VR may be attached to a PCB 108. The liquid-cooled cold plate 102 may be thermally coupled to the VR cold plate 106 via a thermal interface plane 104. In embodiments, the thermal interface plane 104 may provide adjustable thermal coupling based upon its connection to the VR cold plate 106 and the liquid-cooled cold plate 102, as discussed below.

Figure 2:
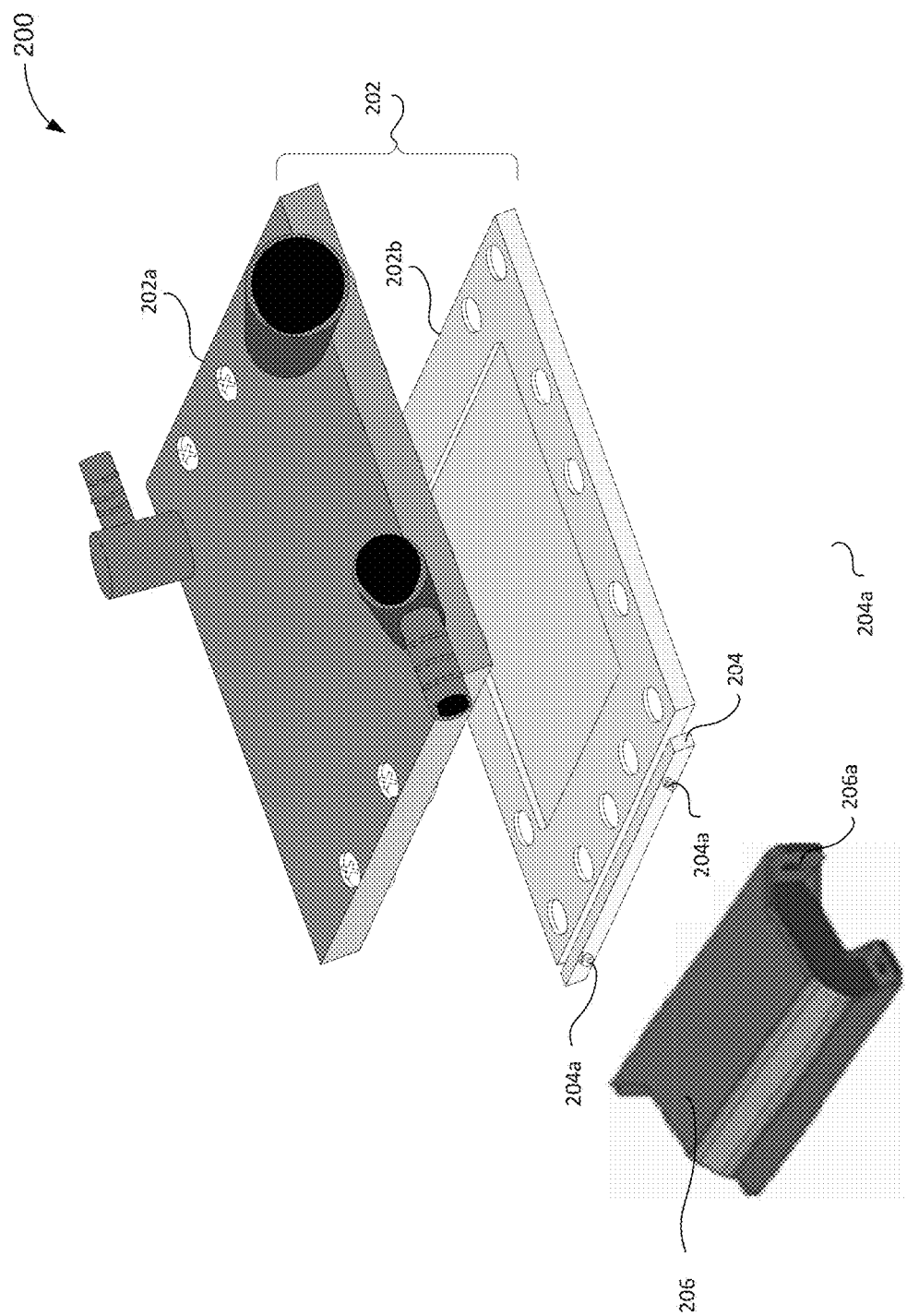
FIG. 2 illustrates an exploded view of components used to implement cooling using adjustable thermal coupling, in accordance with various embodiments.

FIG. 2 illustrates an exploded view of components used to implement cooling using adjustable thermal coupling, in accordance with various embodiments. Diagram 200 shows a liquid-cooled cold plate 202 that may be similar to liquid-cooled cold plate 102 of FIG. 1. In embodiments, the liquid-cooled cold plate 202 may include a liquid-cooled sub plate 202a that may be thermally and/or mechanically coupled to a sub plate 202b. In embodiments, a thermal interface material (TIM) (not shown) may be used to thermally couple the liquid-cooled sub plate 202a and the sub plate 202b to form the liquid-cooled sub plate 202.

In embodiments, a thermal interface plane 204 may be mechanically and/or thermally coupled to the liquid-cooled cold plate 202. In embodiments, this coupling may be immobile and/or fixed. In embodiments, the thermal interface plane 204 may be mechanically and/or thermally coupled to the liquid-cooled sub plate 202a or the sub plate 202b. In embodiments, the thermal interface plane 204 may include one or more attachment features 204a to implement an adjustable thermal coupling with a VR cold plate 206, which may be similar to the VR cold plate 106 of FIG. 1. In embodiments, the adjustable coupling via the thermal interface plane 204 may allow the VR cold plate 206 to be mechanically and/or thermally coupled to the liquid-cooled cold plate 202.

In embodiments, the VR cold plate 206 may include one or more attachment features 206a to implement an adjustable coupling when used in conjunction with one or more attachment features 204a of the thermal interface plane 204. In embodiments, an adjustable coupling may include one or more fasteners that may be inserted through a thermal interface plane attachment feature 204a and fastened to a VR cold plate attachment feature 206a. Fastener 308 of FIG. 3 may be one non-limiting example of a fastener. In embodiments, a fastener may be a threaded screw, a threaded bolt, a rivet, or some other fastener.

In embodiments, the VR cold plate attachment feature 206a may be an elongated hole to receive a fastener. An elongated hole may allow a degree of freedom along an axis providing a plurality of relative positions at which a thermal and/or mechanical connection between the VR cold plate 206 and the thermal interface plane 204 may be set. In embodiments, this plurality of positions may be used to adjust the relative heights of the VR cold plate 206 and the liquid-cooled cold plate 202.

In embodiments, once the relative position has been set, fasteners may be further manipulated to cause the VR cold plate 206 and the thermal interface plane 204 to be immobily coupled, or fixed, at that position. In embodiments, once immobily coupled, heat may then readily flow from the VR cold plate 206 to the liquid-cooled cold plate 202. In embodiments, manipulating the fasters may include screwing in the fasteners to cause the VR cold plate to be securely pressed against the thermal interface plane 204.

In embodiments, thermal conductivity may be enhanced by configuring the surfaces of the VR cold plate 206 and of the thermal interface plane 204 that come into contact. In non-limiting examples, these surfaces may be flat, or may be of some other shape to maximize the material contact, and therefore thermal conductivity, between the VR cold plate 206 and the thermal interface plane 204.

Figure 3:
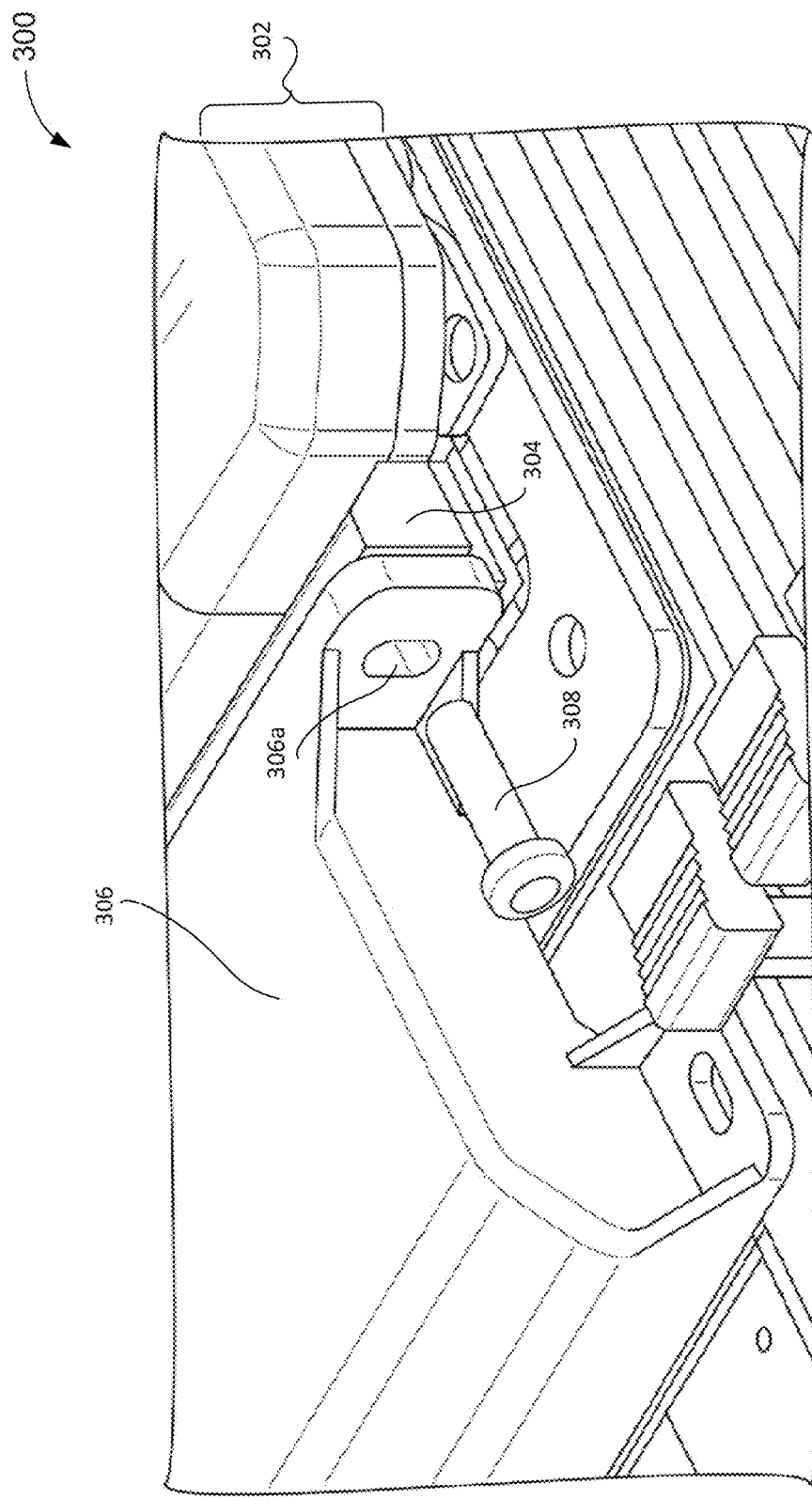
FIG. 3 illustrates an exploded view of adjustable thermal coupling between a liquid-cooled cold plate and another cold plate, in accordance with various embodiments.

FIG. 3 illustrates an exploded view of adjustable thermal coupling between a liquid-cooled cold plate and another cold plate, in accordance with various embodiments. Diagram 300 shows a VR cold plate 306, which may be similar to the VR cold plate 206 of FIG. 2 and the VR cold plate attachment feature 306a, which may be similar to the VR cold plate attachment feature 206a of FIG. 2. A fastener 308 is to be inserted through the VR cold plate attachment feature 306a and into the attachment feature (not shown) of the thermal interface plane 304, which may be similar to the thermal interface plane 204 of FIG. 2. The thermal interface plane 304 may be immobily and thermally coupled to the liquid-cooled cold plate 302, which may be similar to the liquid-cooled cold plate 202 of FIG. 2.

As alluded to above, the VR cold plate attachment feature 306a may be elongated to allow the relative position of the VR cold plate 306 to move up and down relative to the position of the thermal interface plane 304 while the fastener 308 is inserted but not yet tightened. In embodiments, the VR cold plate attachment feature 306a may take other shapes that may be used to allow the VR cold plate 306 to move in other directions prior to the fastener 308 being secured to the thermal interface plane 304. For example if the VR cold plate 306 needed to be adjusted laterally with respect to the PCB in order to thermally couple with a VR component (not shown), the VR cold plate attachment feature 306a may be elongated in a horizontal direction.

Figure 4:
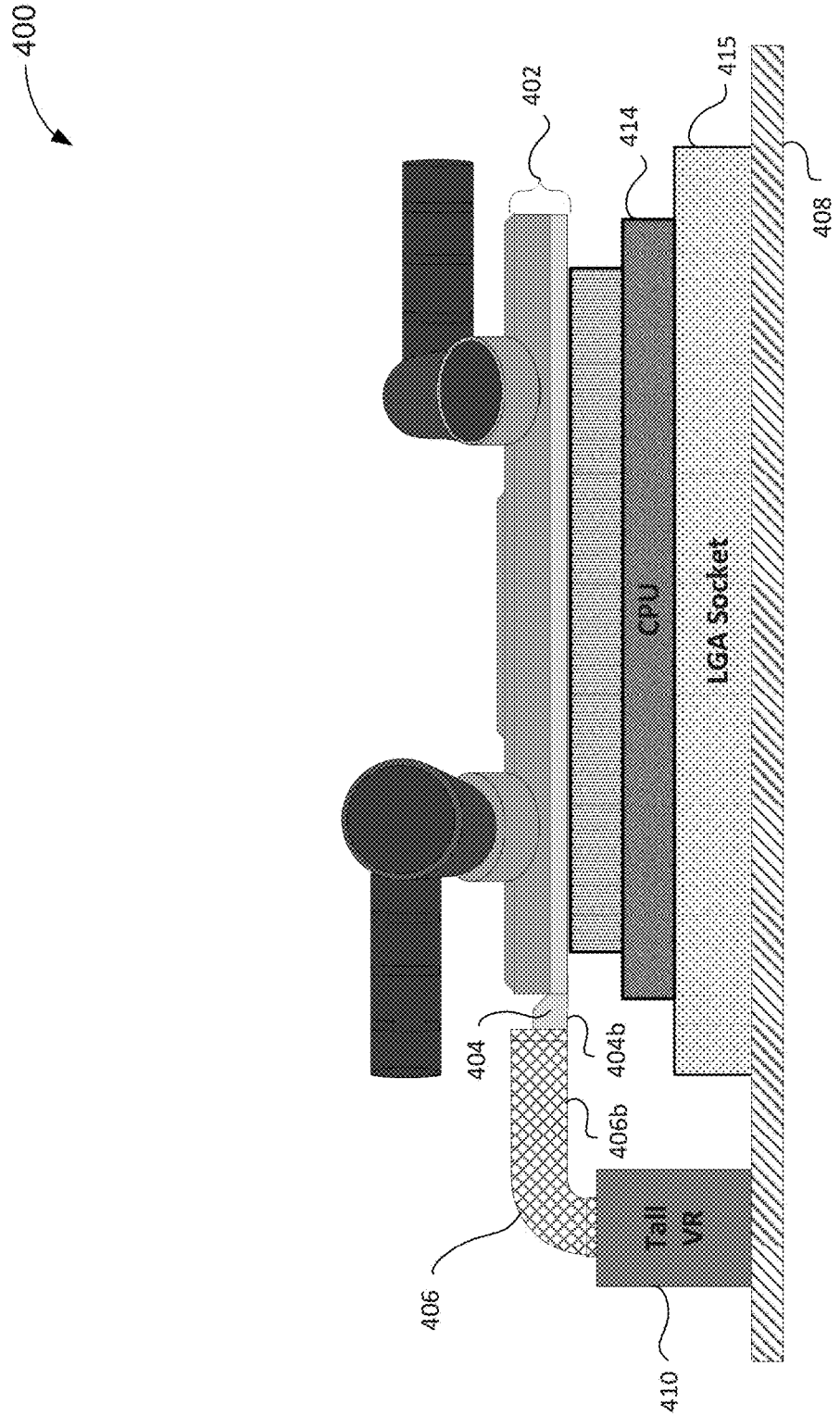
FIG. 4 illustrates a first example of an adjustable thermal coupling configured for a tall voltage regulator, in accordance with various embodiments.

FIG. 4 illustrates a first example of an adjustable thermal coupling configured for a tall voltage regulator, in accordance with various embodiments. For the purpose of this Specification, a voltage regulator may be considered a tall voltage regulator if it has a height in the Z-dimension higher than the combined height in the Z-dimension of the CPU 414 and the socket 415, presenting a potential coupling issue for the CPU and VR cold plates. An example of socket 415 may be, but is not limited to, a land grid array (LGA) socket. FIG. 400 shows a first side view of a liquid-cooled cold plate 402, which may be similar to liquid-cooled cold plate 202 of FIG. 2 that may be cooling a CPU 414 attached to a PCB 408.

A VR component 410, attached to the PCB 408, may be thermally coupled to a VR cold plate 406, which may be similar to the VR cold plate 206 of FIG. 2. The VR cold plate 406 may be thermally coupled to the thermal interface plane 404, which may be similar to the thermal interface plane 204 of FIG. 2. The liquid-cooled cold plate 402 may be immobily attached to the thermal interface plane 404.

In this example, the VR component 410 may be taller with respect to a height perpendicular to the PCB 408. To achieve an acceptable thermal coupling, the VR cold plate 406 and the thermal interface plane 404 may be adjusted such that the bottom of the VR cold plate 406b and the bottom of the thermal interface plane 404b may be aligned as shown. As a result, this will create a mechanical and/or thermal coupling between the VR cold plate 406 and the liquid-cooled cold plate 402 that may be properly adapted to the height of the VR component 410 without placing undue torque on the PCB 408.

Figure 5:
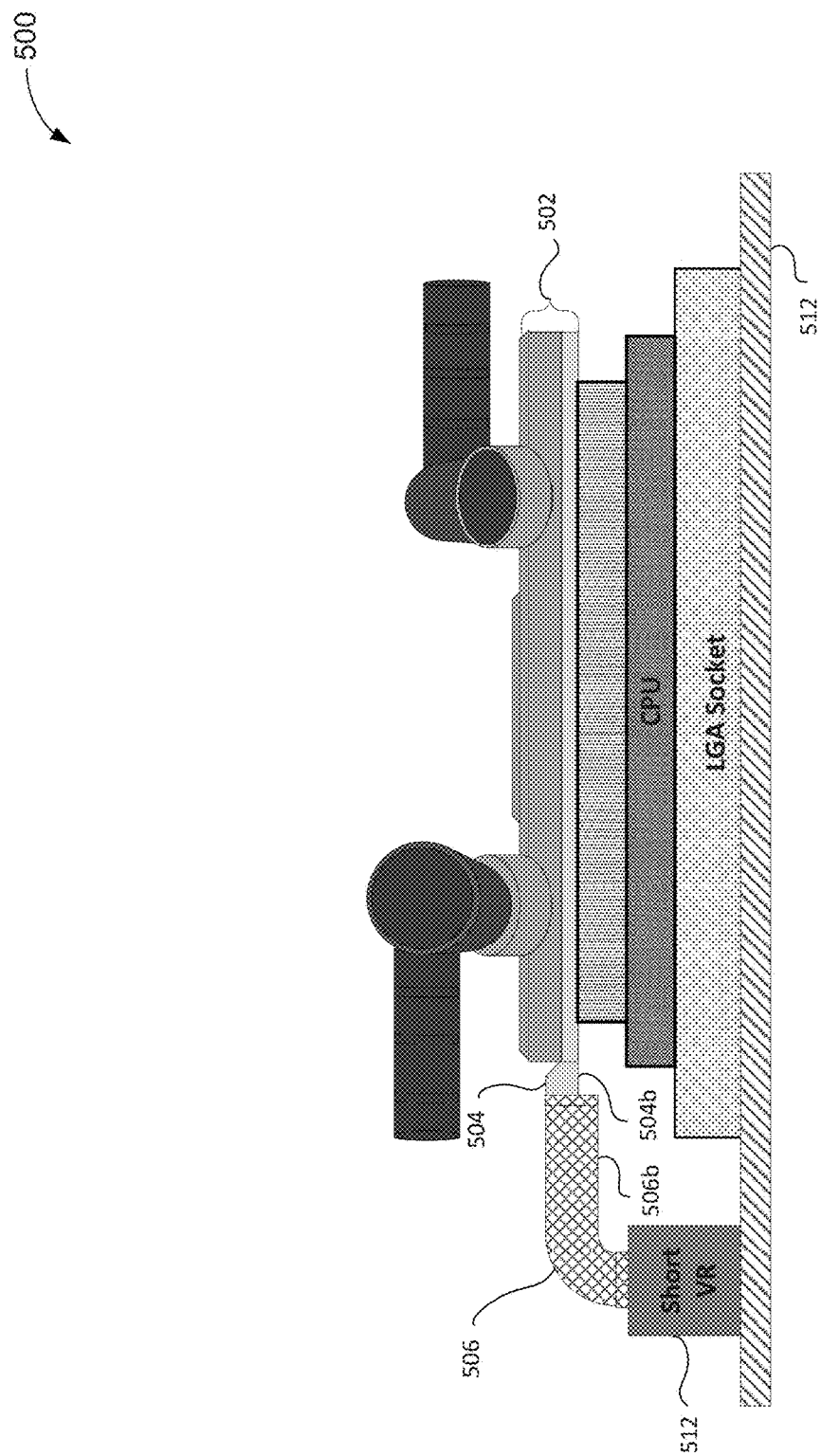
FIG. 5 illustrates a second example of an adjustable thermal coupling configured for a short voltage regulator, in accordance with various embodiments.

FIG. 5 illustrates a second example of an adjustable thermal coupling configured for a short voltage regulator, in accordance with various embodiments. For the purpose of this Specification, a voltage regulator may be considered a short voltage regulator if it has a height in the Z-dimension shorter the combined height in the Z-dimension of the CPU and the socket, presenting a potential coupling issue for the CPU and VR cold plates. Diagram 500 shows a second side view that is similar to diagram 400 of FIG. 4, except that the VR component 512 has a shorter height than the VR component 412 of FIG. 4.

In this example, the relative positions of the VR cold plate 506 and the thermal interface plane 504 may be adjusted to be in a position that is different than that shown for thermal interface plane 404 in FIG. 4. In diagram 500, the bottom of the VR cold plate 506b is not in alignment with the bottom of the thermal interface plane 504c. Because of the shorter height of the VR component 512, a different alignment from that shown in FIG. 4 is needed to create a mechanical and/or thermal coupling between the VR cold plate 506 and the liquid-cooled cold plate 502 without placing undue torque on the PCB 508.

Figure 6:
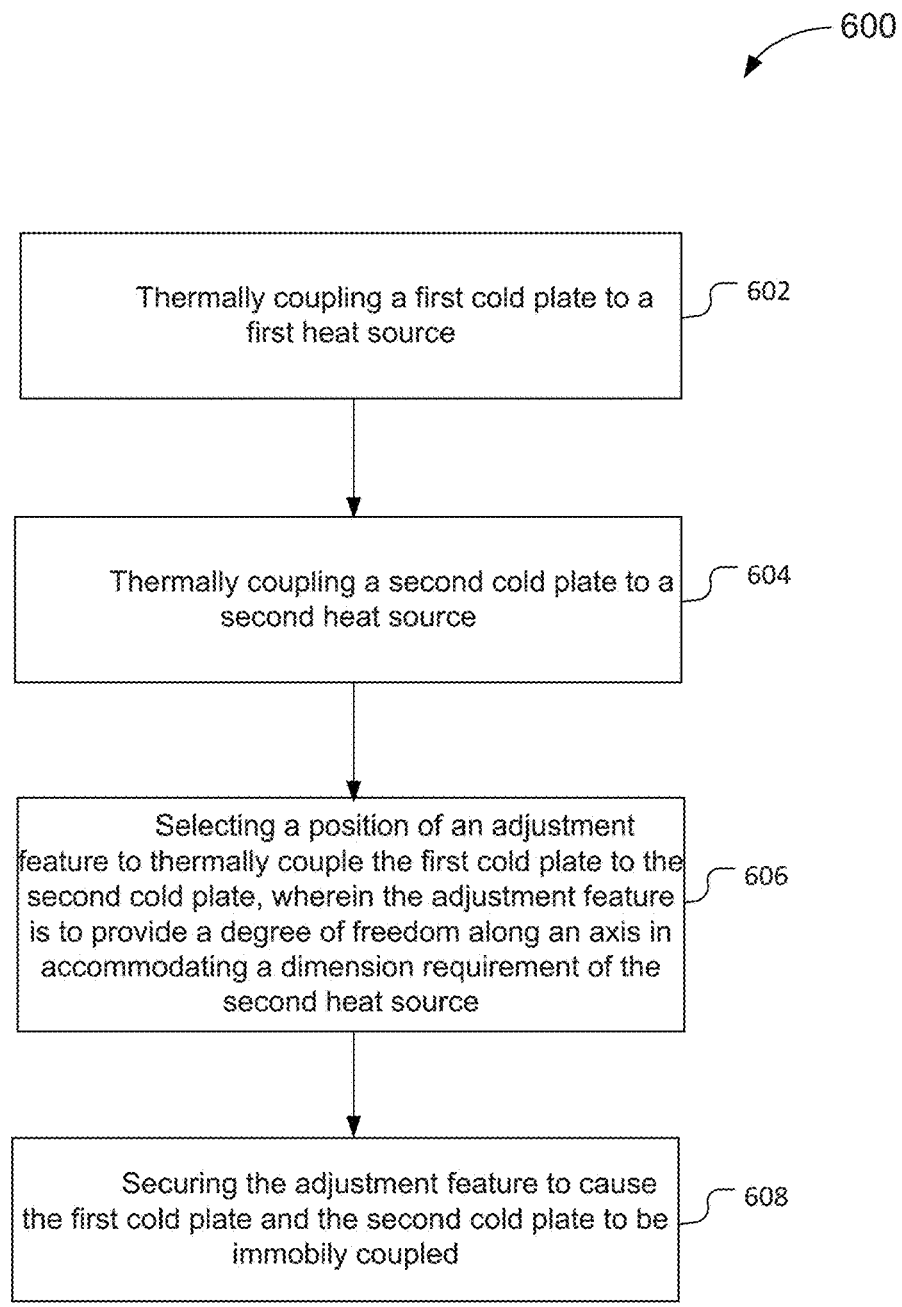
FIG. 6 illustrates a block diagram of a process for implementing an adjustable thermal coupling between a liquid-cooled cold plate and a cold plate thermally coupled to a voltage regulator, in accordance with various embodiments.

FIG. 6 illustrates a block diagram of a process for implementing an adjustable thermal coupling between a liquid-cooled cold plate coupled to a CPU and a cold plate thermally coupled to a voltage regulator, in accordance with various embodiments. The process 600 may be implemented using the VR cooling plate 206, VR cooling plate attachment features 206a, thermal interface plane 204, thermal interface plane attachment features 204a, and liquid-cooled cooling plate 202 of FIG. 2, and the fastener 308 of FIG. 3.

At block 602, the process may include thermally coupling a first cold plate to a first heat source. In embodiments, the first heat source may be a VR component 410 of FIG. 4. The first cold plate may be the VR cold plate 206 of FIG. 2. In embodiments, the thermal coupling may include mechanically coupling the VR cold plate 206 with the VR component 410 so that heat may be readily transferred between the components. In embodiments, a thermal interface material may be used to thermally couple the VR cold plate 206 and VR component 410.

At block 604, the process may include thermally coupling a second cold plate to a second heat source. In embodiments, the second heat source may be a CPU 414 of FIG. 4. The second cold plate may be the liquid-cooled cold plate 202 of FIG. 2. In embodiments, the thermal coupling may include mechanically coupling the CPU 414 with the liquid-cooled cold plate 212 so that heat may be readily transferred between the components. In embodiments, a thermal interface material may be used to thermally couple the CPU 414 with the liquid-cooled cold plate 212.

At block 606, the process may include selecting a position of an adjustment feature to thermally couple the first cold plate to the second cold plate, wherein the adjustment feature is to provide a degree of freedom along an axis in accommodating a dimension requirement of the second heat source. In embodiments, the adjustment feature may include the thermal interface plane 404 of FIG. 4 that may be mechanically and/or thermally coupled to the first cold plate, which may be a VR cold plate 406 and to the second cold plate, which may be the liquid-cooled cold plate 402. In embodiments, as referred to above, an adjustment feature may enable thermal coupling between the thermal interface plane 404 and the VR cold plate 406 in a variety of positions. For example, the adjustment feature may provide a degree of freedom along an axis representing a height of the VR component 410 above the PCB 408.

At block 608, the process may include securing the adjustment feature to cause the first cold plate and the second cold plate to be immobily coupled. In embodiments, the thermal interface plane 304 may be immobily coupled to the liquid-cooled cold plate 302 of FIG. 3. Securing the adjustment feature may include modifying the fastener 308 of FIG. 3 that may be inserted into the VR cold plate attachment feature 306a. In non-limiting examples, the fastener 308 may be a threaded bolt that is tightened into a threaded hole within the thermal interface plane 304 to immobily couple the VR cold plate 306 to the liquid-cooled cold plate 302. The result of this immobile coupling may be to immobily couple the VR cold plate 304 and the liquid-cooled cold plate 302.

In embodiments, the process may result in efficient heat flow from the VR to the liquid-cooled cold plate of the CPU that minimizes torque on the PCB on which the VR component and the CPU may be attached.

Various operations are described as multiple discrete operations in turn, in a manner that is most helpful in understanding the claimed subject matter. However, the order of description should not be construed as to imply that these operations are necessarily order dependent.

Examples

Thus various example embodiments of the present disclosure have been described including, but are not limited to:

Example 1 may be a cooling apparatus, comprising: a first cold plate that is liquid cooled and thermally coupled to a first heat source; a second cold plate thermally coupled to a second heat source; an adjustable coupling to thermally couple the first cold plate to the second cold plate, wherein the adjustable coupling comprises an adjustment feature to provide a degree of freedom along an axis in accommodating a dimension requirement of the second heat source.

Example 2 may include the cooling apparatus of example 1, wherein the adjustment feature comprises an elongated hole to receive a fastener.

Example 3 may include the cooling apparatus of example 2, wherein the elongated hole is in a flange of the second cold plate and the fastener is a threaded screw or threaded bolt inserted through the elongated hole into the first cold plate.

Example 4 may include the cooling apparatus of example 1, wherein to thermally couple the first cold plate to the second cold plate comprises to thermally couple a surface of the first cold plate to a surface of the second cold plate.

Example 5 may include the cooling apparatus of example 4, wherein the surface of the first cold plate and the surface of the second cold plate may be thermally coupled in a plurality of configurations.

Example 6 may include the cooling apparatus of example 1, wherein the adjustment feature is to cause the first cold plate and the second cold plate to be immobily coupled.

Example 7 may include the cooling apparatus of example 6, wherein the first heat source and the second heat source are attached to the same printed circuit board, PCB.

Example 8 may include the cooling apparatus of example 7, wherein to be immobily coupled is to further reduce torque on the PCB.

Example 9 may include the cooling apparatus of any examples 1-8, wherein the first heat source is a central processing unit, CPU.

Example 10 may include the cooling apparatus of any examples 1-8, wherein the first cold plate or the second cold plate is a copper plate.

Example 11 may include the cooling apparatus of any examples 1-8, wherein the second heat source is a voltage regulator, VR.

Example 12 may be a method for cooling an apparatus, the method comprising:
thermally coupling a first cold plate to a first heat source;
thermally coupling a second cold plate to a second heat source; positioning an adjustment feature to thermally couple the first cold plate to the second cold plate, wherein the adjustment feature is to provide a degree of freedom along an axis in accommodating a dimension requirement of the second heat source; and securing the adjustment feature to cause the first cold plate and the second cold plate to be immobily coupled.

Example 13 may include the method of example 12, wherein the adjustment feature comprises an elongated hole to receive a fastener.

Example 14 may include the method of example 13, wherein securing the adjustment feature comprises securing a threaded screw or threaded bolt through the elongated hole in the second cold plate into the first cold plate.

Example 15 may include the method of example 12, wherein thermally coupling the first cold plate to the second cold plate comprises thermally coupling a surface of the first cold plate to a surface of the second cold plate.

Example 16 may include the method of example 15, wherein the surface of the first cold plate and the surface of the second cold plate may be thermally coupled in a plurality of configurations.

Example 17 may include the method of example 12, wherein the adjustment feature is to cause the first cold plate and the second cold plate to be immobily coupled.

Example 18 may include the method of example 17, wherein the first heat source and the second heat source are attached to the same printed circuit board, PCB.

Example 19 may include the method of example 18, wherein to be immobily coupled is to further reduce torque on the PCB.

Example 20 may include the method of any examples 12-19, wherein the first heat source is a central processing unit, CPU.

Example 21 may include the method of any examples 12-19, wherein the first cold plate is liquid cooled.

Example 22 may include the method of any examples 12-19, wherein the second heat source is a voltage regulator, VR.

Example 23 may be a cooling apparatus comprising: means for thermally coupling a first cold plate to a first heat source; means for thermally coupling a second cold plate to a second heat source; means for positioning an adjustment feature to thermally couple the first cold plate to the second cold plate, wherein the adjustment feature is to provide a degree of freedom along an axis in accommodating a dimension requirement of the second heat source; and means for securing the adjustment feature to cause the first cold plate and the second cold plate to be immobily coupled.

Example 24 may include the apparatus of example 23, wherein the adjustment feature comprises an elongated hole to receive a fastener.

Example 25 may include the apparatus of example 24, wherein securing the adjustment feature comprises means for securing a threaded screw or threaded bolt through the elongated hole in the second cold plate into the first cold plate.

Example 26 may include the apparatus of example 23, wherein thermally coupling the first cold plate to the second cold plate comprises means for thermally coupling a surface of the first cold plate to a surface of the second cold plate.

Example 27 may include the apparatus of example 26, wherein the surface of the first cold plate and the surface of the second cold plate may be thermally coupled in a plurality of configurations.

Example 28 may include the apparatus of example 23, wherein the adjustment feature is to cause the first cold plate and the second cold plate to be immobily coupled.

Example 29 may include the apparatus of example 28, wherein the first heat source and the second heat source are attached to the same printed circuit board, PCB.

Example 30 may include the apparatus of example 29, wherein to be immobily coupled is to further reduce torque on the PCB.

Example 31 may include the apparatus of any one of examples 23-30, wherein the first heat source is a central processing unit, CPU.

Example 32 may include the apparatus of any one of examples 23-30, wherein the first cold plate is liquid cooled.

Example 33 may include the apparatus of any one of examples 23-30, wherein the second heat source is a voltage regulator, VR.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. A cooling apparatus, comprising:
   a first cold plate thermally coupled to a first heat source;
   a second cold plate thermally coupled to a second heat source;
   an adjustable coupling to physically and thermally couple a surface of the first cold plate to a surface of the second cold plate, wherein the adjustable coupling includes an adjustment feature with an elongated hole to receive a fastener; and
   wherein the elongated hole is to allow multiple fixed physical coupling positions of the first cold plate in relation to a plurality of heights of the second cold plate along a direction of elongation perpendicular to a length of the first cold plate.

2. The cooling apparatus of claim 1, wherein the elongated hole is in a flange of the second cold plate and the fastener is a threaded screw or threaded bolt inserted through the elongated hole into the first cold plate.

3. The cooling apparatus of claim 1, wherein the surface of the first cold plate and the surface of the second cold plate may be thermally coupled in a plurality of configurations.

4. The cooling apparatus of claim 1, wherein the adjustment feature is to cause the first cold plate and the second cold plate to be immobily coupled.

5. The cooling apparatus of claim 4, wherein the first heat source and the second heat source are attached to a same printed circuit board, PCB.

6. The cooling apparatus of claim 5, wherein to be immobily coupled is to further reduce torque on the PCB.

7. The cooling apparatus of claim 1, wherein the first heat source is a central processing unit, CPU.

8. The cooling apparatus of claim 1, wherein the first cold plate or the second cold plate is a copper plate.

9. The cooling apparatus of claim 1, wherein the second heat source is a voltage regulator, VR.

10. A method for cooling an apparatus, the method comprising:
    thermally coupling a first cold plate to a first heat source;
    thermally coupling a second cold plate to a second heat source;
    positioning an adjustment feature to thermally couple a surface of the first cold plate to a surface of the second cold plate, wherein the adjustment feature comprises an elongated hole to receive a fastener, and wherein the elongated hole is to allow multiple fixed physical coupling positions of the first cold plate in relation to a plurality of heights of the second cold plate along a direction of elongation perpendicular to a length of the first cold plate; and
    securing the adjustment feature to cause the first cold plate and the second cold plate to be immobily coupled.

11. The method of claim 10, wherein securing the adjustment feature comprises securing a threaded screw or threaded bolt through the elongated hole in the second cold plate into the first cold plate.

12. The method of claim 10, wherein the surface of the first cold plate and the surface of the second cold plate may be thermally coupled in a plurality of configurations.

13. The method of claim 10, wherein the adjustment feature is to cause the first cold plate and the second cold plate to be immobily coupled.

14. The method of claim 13, wherein the first heat source and the second heat source are attached to a same printed circuit board, PCB.

15. The method of claim 14, wherein to be immobily coupled is to further reduce torque on the PCB.

16. The method of claim 10, wherein the first heat source is a central processing unit, CPU.

17. The method of claim 10, wherein the first cold plate is liquid cooled.

18. The method of claim 10, wherein the second heat source is a voltage regulator, VR.

19. A cooling apparatus comprising:
    means for thermally coupling a first cold plate to a first heat source;
    means for thermally coupling a second cold plate to a second heat source;
    means for positioning an adjustment feature to thermally couple a surface of the first cold plate to a surface of the second cold plate, wherein the adjustment feature comprises an elongated hole to receive a fastener, and wherein the elongated hole is to allow multiple fixed physical coupling positions of the first cold plate in relation to a plurality of heights of the second cold plate along a direction of elongation perpendicular to a length of the first cold plate; and
    means for securing the adjustment feature to cause the first cold plate and the second cold plate to be immobily coupled.

20. The apparatus of claim 19, wherein securing the adjustment feature comprises means for securing a threaded screw or threaded bolt through the elongated hole in the second cold plate into the first cold plate.

* * * * *